United States Patent [19]

Alber et al.

[11] Patent Number: 4,707,795

[45] Date of Patent: Nov. 17, 1987

[54] BATTERY TESTING AND MONITORING SYSTEM

[75] Inventors: Carl H. Alber; Glenn Alber, both of Boca Raton, Fla.

[73] Assignee: Alber Engineering, Inc., Boca Raton, Fla.

[21] Appl. No.: 746,754

[22] Filed: Jun. 20, 1985

Related U.S. Application Data

[63] Continuation-in-part of Ser. No. 475,321, Mar. 14, 1983, abandoned.

[51] Int. Cl.⁴ ............................................. G01N 27/46
[52] U.S. Cl. .................................. 364/550; 324/433; 364/483
[58] Field of Search ............... 364/483, 550, 551, 554; 324/427–429, 433; 340/636; 320/48

[56] References Cited

U.S. PATENT DOCUMENTS

| | | | |
|---|---|---|---|
| 3,593,099 | 7/1971 | Scholl | 324/429 X |
| 4,297,639 | 10/1981 | Branham | 324/429 |
| 4,322,685 | 3/1982 | Frailing et al. | 324/429 |
| 4,352,067 | 9/1982 | Ottone | 324/429 X |
| 4,423,378 | 12/1983 | Marino et al. | 324/429 X |
| 4,423,379 | 12/1983 | Jacobs et al. | 324/429 |
| 4,433,295 | 2/1984 | Zangg | 324/429 |
| 4,520,353 | 5/1985 | McAuliffe | 324/429 X |

*Primary Examiner*—Gary V. Harkcom
*Assistant Examiner*—H. R. Herndon
*Attorney, Agent, or Firm*—Sherman and Shalloway

[57] ABSTRACT

A battery testing and monitoring system specifically designated to continuously monitor overall battery voltage, conditions of individual cells or cell groups such as voltage, current and temperature as well as individual cell or cell group failures, conduction path failures and other conditions. The system is a portable or permanently installed unit having connectable thereto a programming/display/printer terminal which enables the programming of the monitor with various failure conditions as desired and also enables the printing of a permanent rocord of any testing procedure. Additionally, portable load units may be interconnected with the inventive monitor and the battery or batteries which are being tested and monitored so as to enable the testing and/or monitoring of such battery or batteries under controlled load conditions.

10 Claims, 12 Drawing Figures

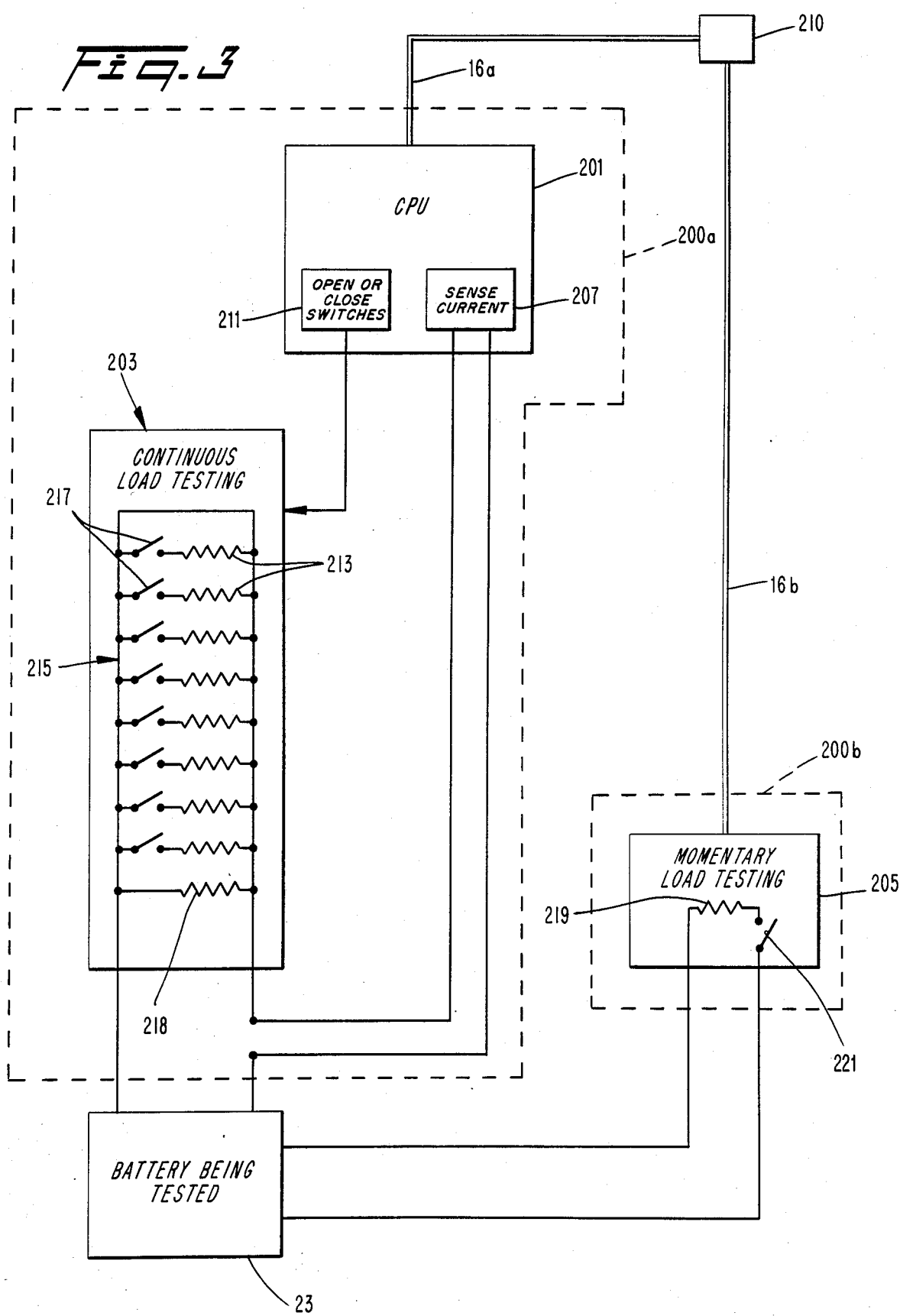

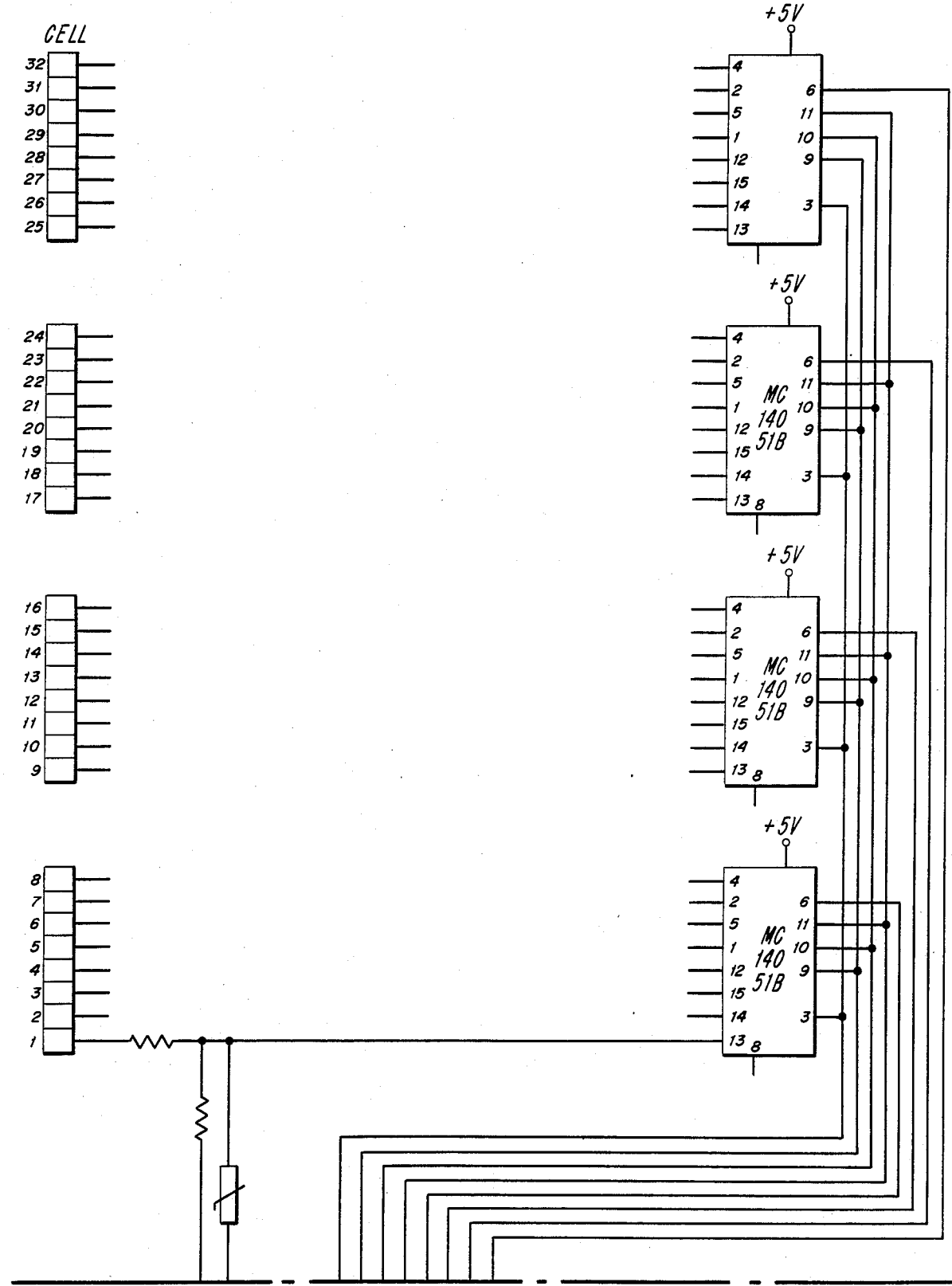
Fig. 4-a

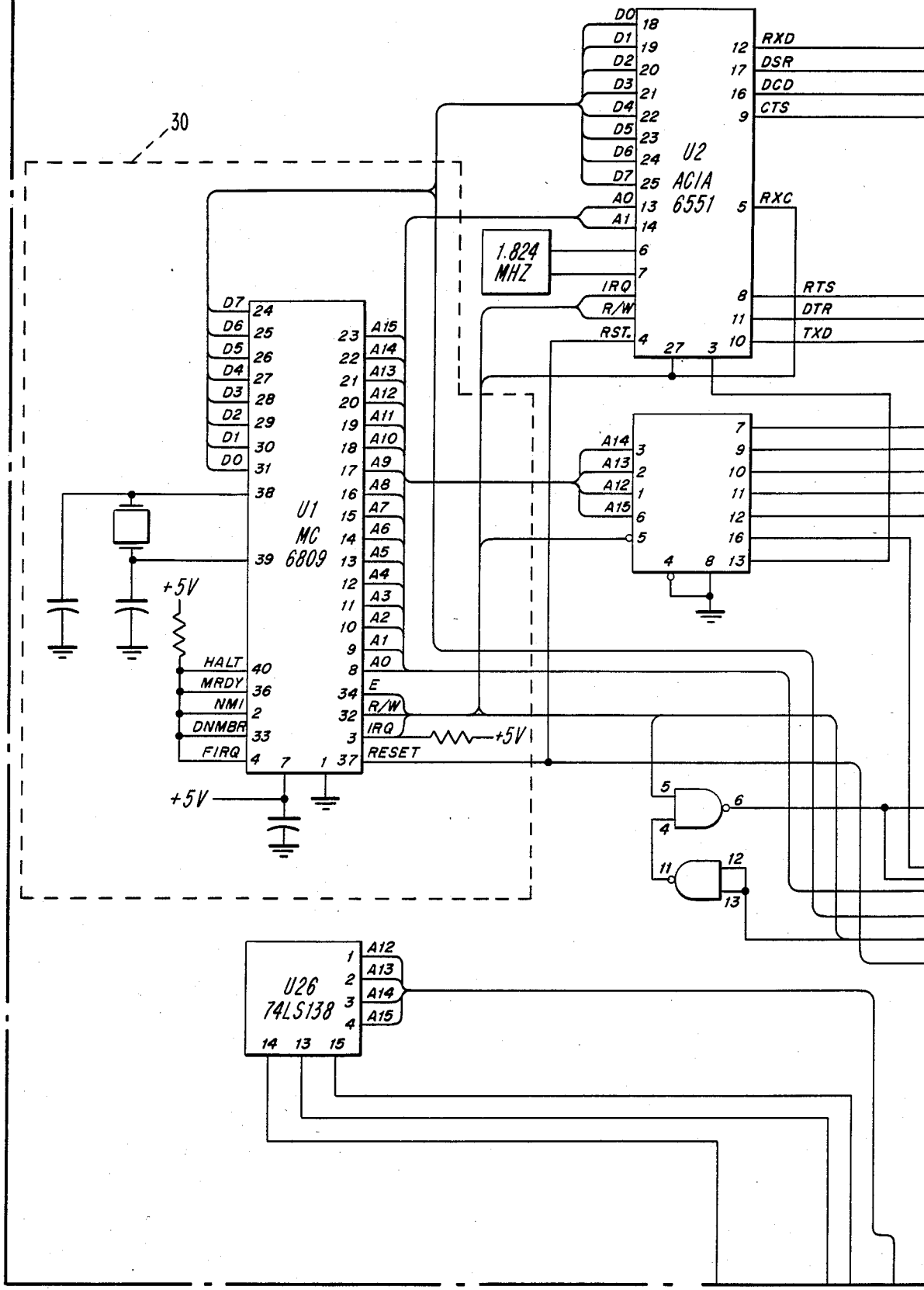
Fig. 4-b

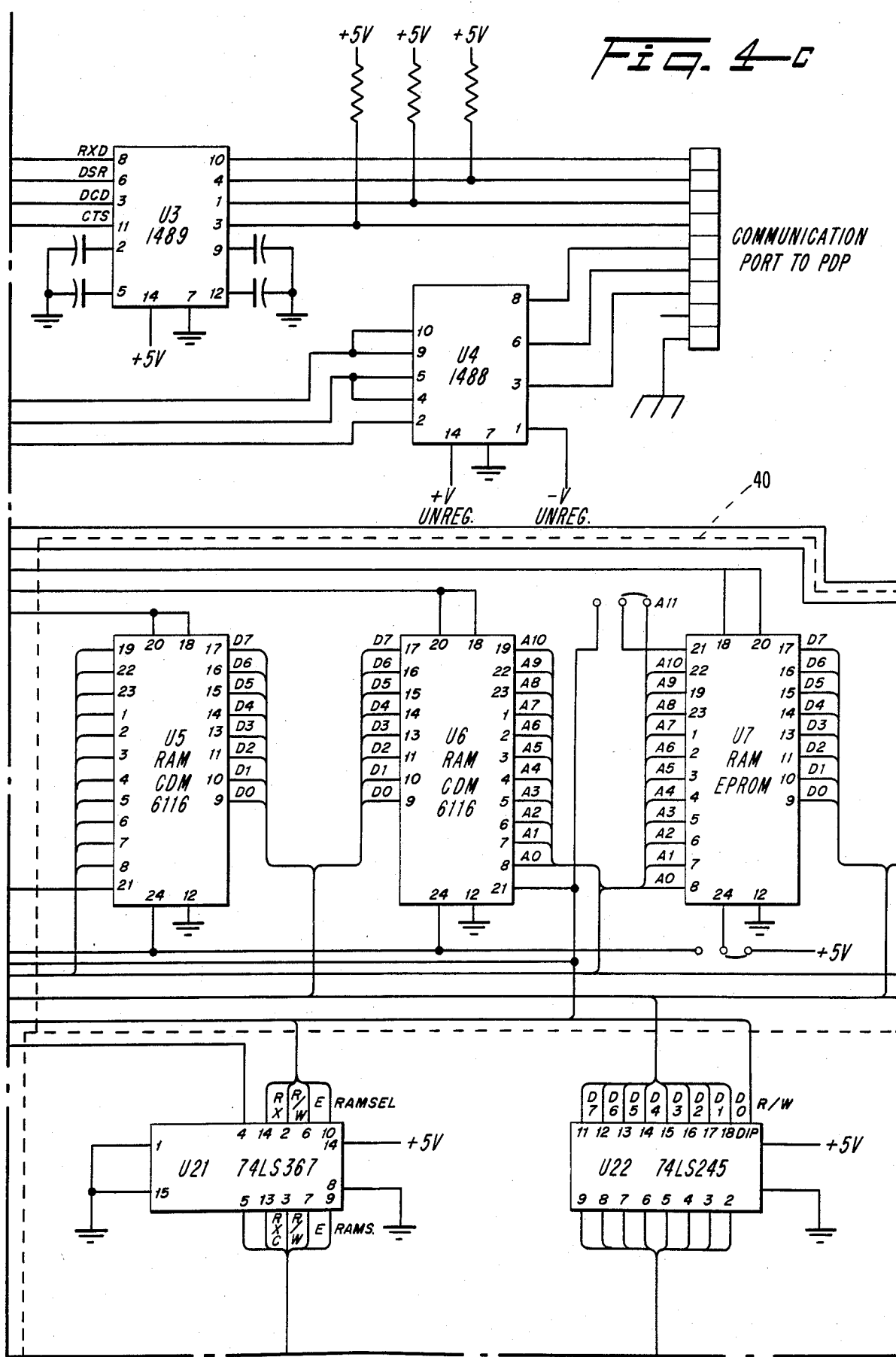
Fig. 4-c

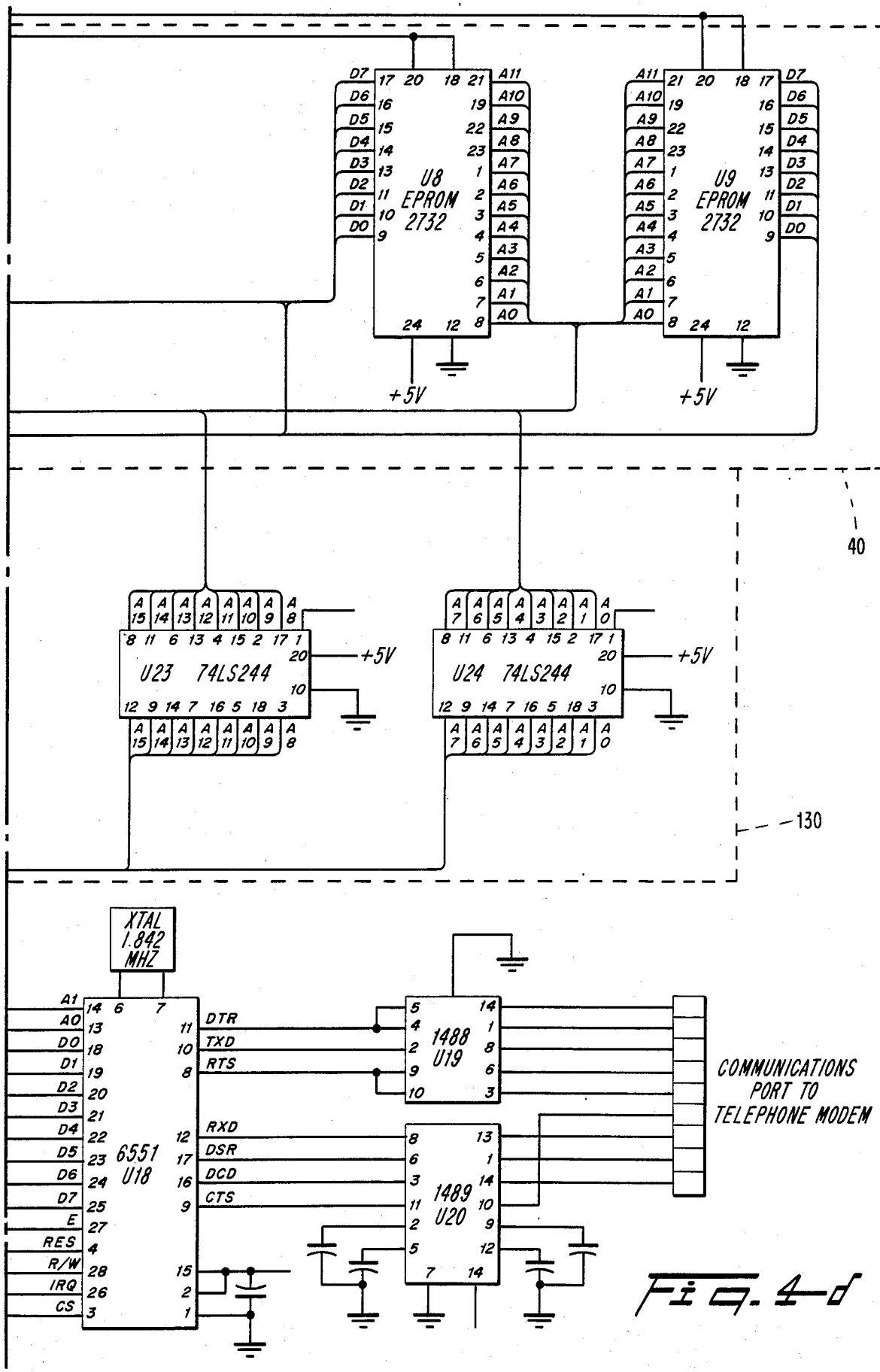
Fig. 4-d

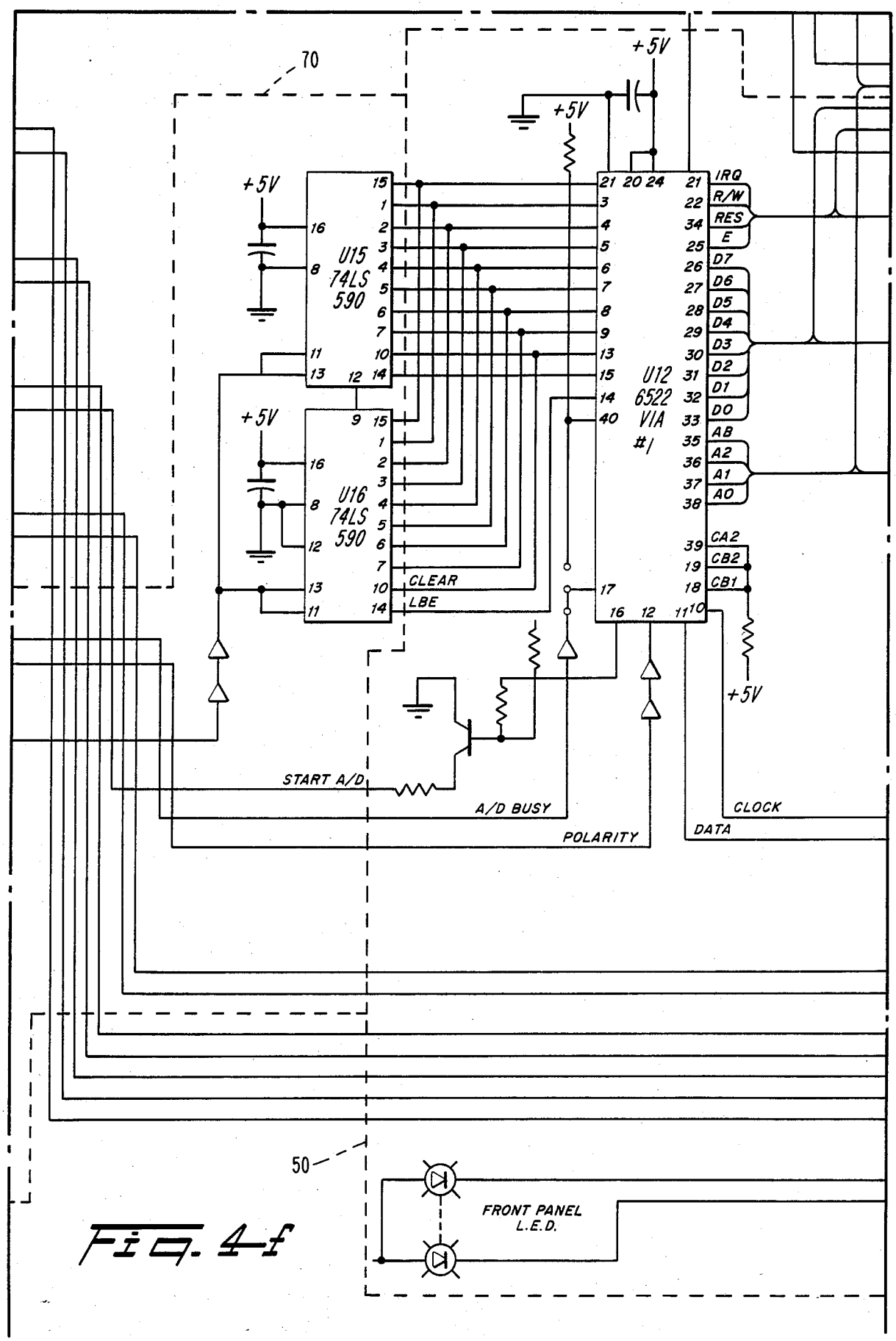
FIG. 4-f

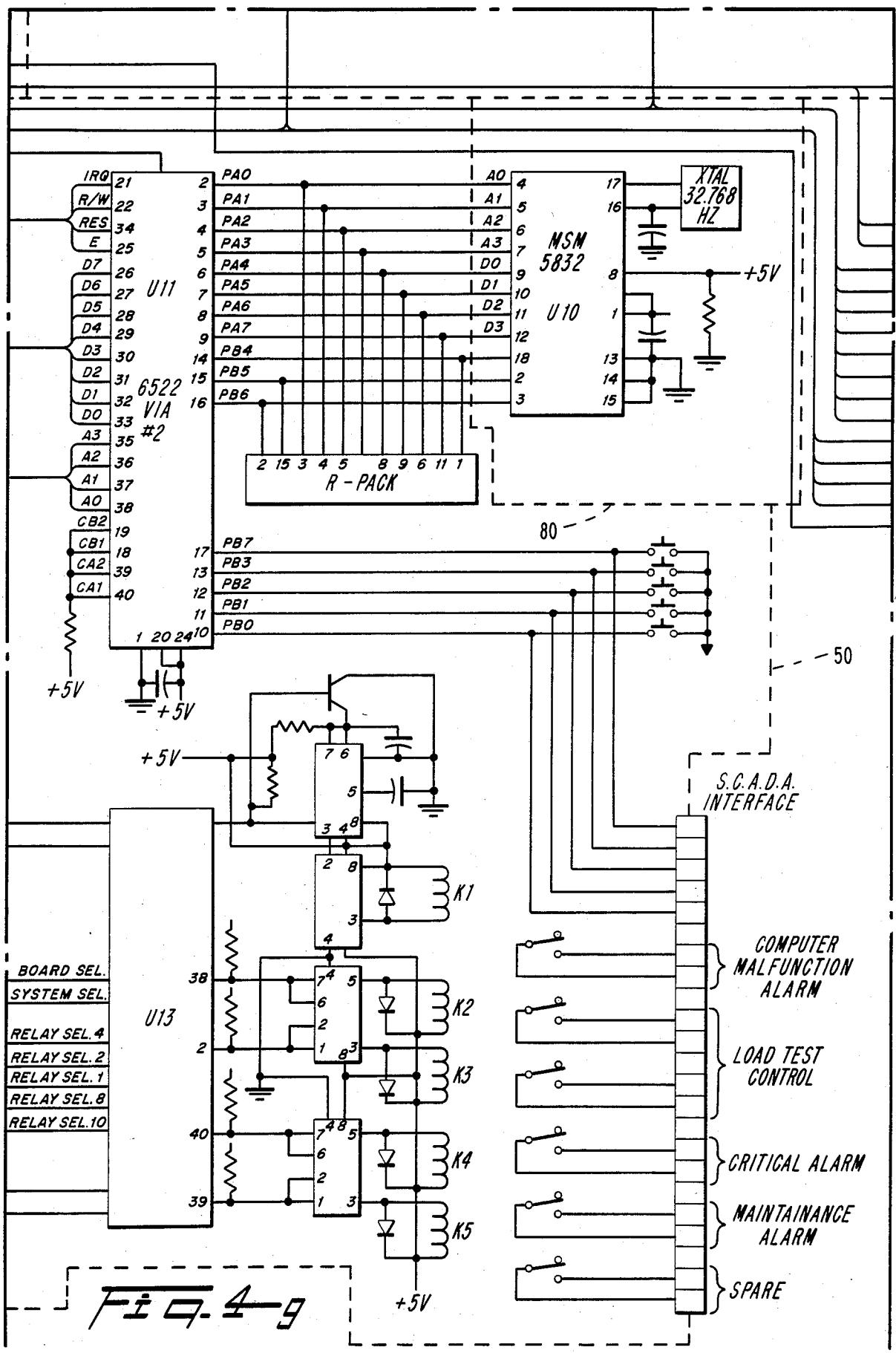

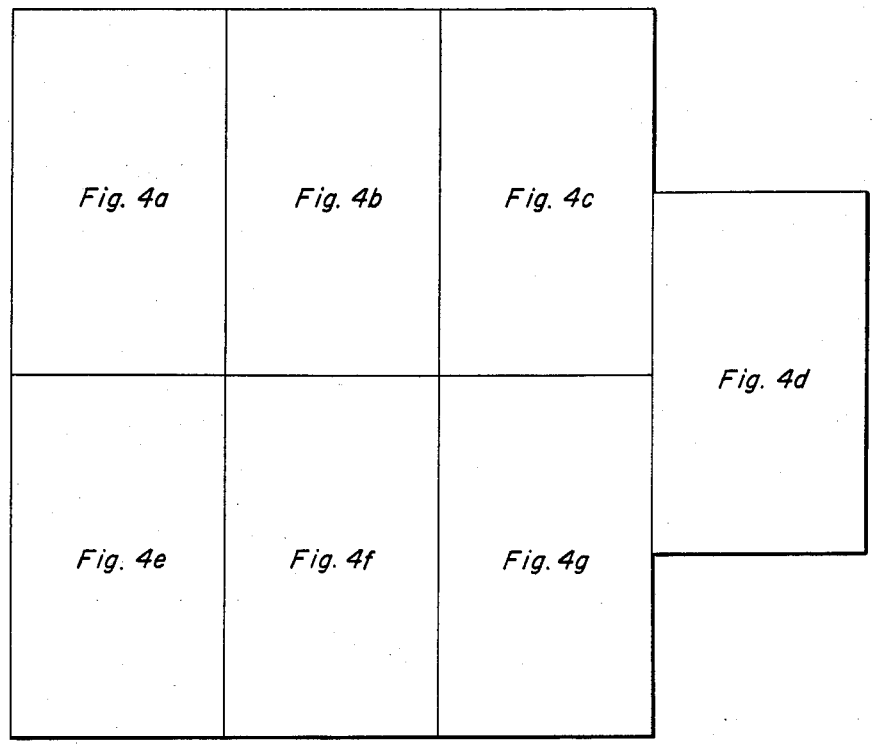
Fig. 4-h
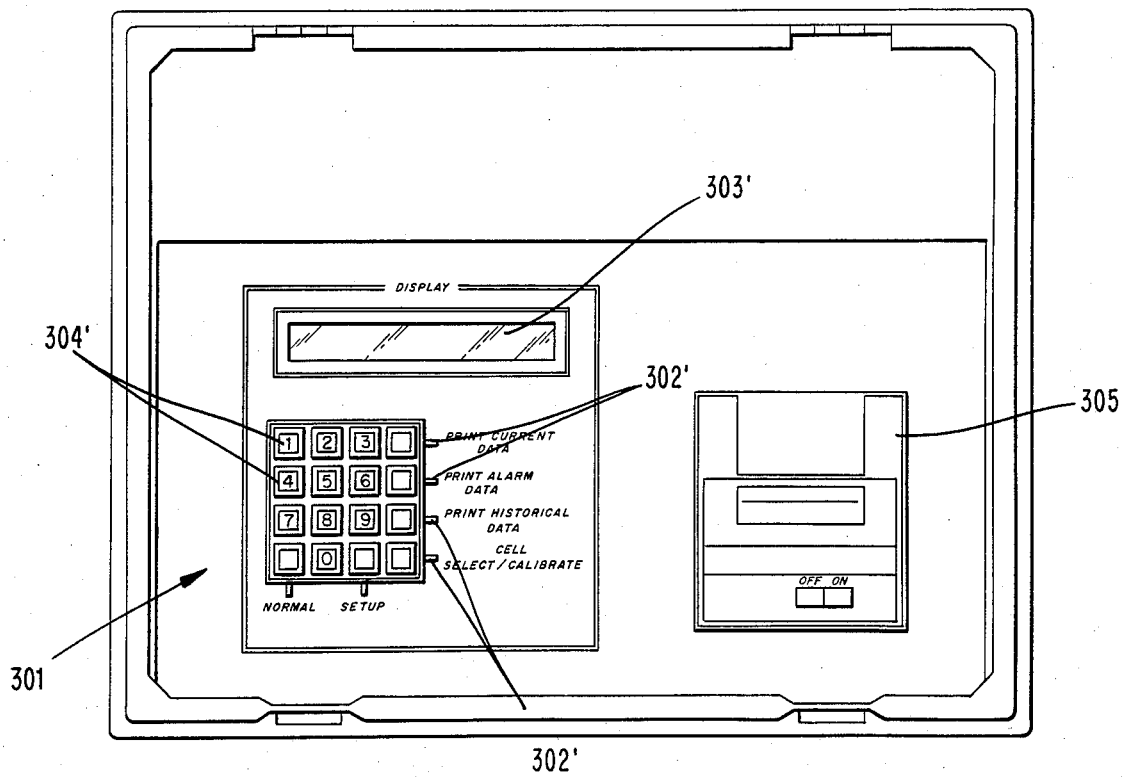
Fig. 5

BATTERY TESTING AND MONITORING SYSTEM

This application is a Continuation-in-Part of application Ser. No. 475,321 filed Mar. 14, 1983, for "Battery Testing System", now abandoned.

BACKGROUND OF THE INVENTION

With the evolution of technology in the Electric Power Generating industry, battery systems came to play a critical roll in providing back-up energy in emergency situations. When emergencies occur, it's essential that the battery systems perform as designed or serious consequences result because of failure or partial failure of the battery system.

In the past, maintenance programs were designed to evaluate batteries and battery systems under static conditions. Although conscientiously implemented, these methods proved ineffective. Specific Gravity Readings, Cell Voltage Measurements and Electrolyte Level Maintenance provide information regarding potential, but do not accurately evaluate operational capability. Using only these methods, batteries, and battery systems can appear perfectly sound, but fail when called upon to supply emergency power.

In 1968, the Institute of Electrical Engineers (IEEE) became active in the development of standards for batteries and quickly discovered accepted practices to be ineffective. In depth studies determined that the only positive means to evaluate the operational integrity of battery systems is discharge testing. Exercising systems under actual operating conditions is the only method of assuring all components functionally capably.

Recognizing a need, the IEEE prepared documents to be used as industry standards to improve methods of battery evaluation.

In addition to previous practices, discharge testing, at specific time intervals, was presented as a necessary test procedure to enhance the maintenance/test programs, since it's desirable to monitor battery systems after they are connected as emergency power sources. Monitoring should be on a continual basis and should detect weaknesses in the operational integrity of the system, so preventative maintenance can be instituted. Past methods of monitoring although appearing sound have also been proven ineffective, resulting in personnel injury and exorbitant costs to the power industry. Experience has shown that equipment presently used monitors only static conditions and does not determine operational integrity. The parameters monitored consist of Overvoltage, Ground Faults and Undervoltage conditions and although valid indications of potential faults, one critically important ingredient is missing, that of Load Testing. Most battery, battery strap and connection problems can only be detected while current is flowing. It is therefore essential that periodic load tests be performed.

The first major power company to recognize load testing as an essential feature for battery system monitoring was Louisiana Power & Light. In 1980, a load test was implemented by Louisiana Power & Light personnel as the initial step to evaluate system integrity. That is, such load tests looked at the overall voltage of the entire battery system to show that the entire battery system could supply the proper output. This was not a reliable test. Although sound in theory, their approach to this problem was not totally effective. The concept certainly addressed the need for exercising battery systems under actual operating conditions and detection of faults resulting in an open loop situation. The test method did not however, detect system degradation, therefore potential failures went unnoticed. This lack of detection resulted in a major failure which threatened the life of a maintenance man and caused a substation melt down.

Also, in the past, batteries were three-cell units, 100 Ah, lead-calcium battery, a standard for many year making up about 80% of the station batteries in service today. This battery utilizes a leaded on/flag-type terminal for interconnection with $\frac{1}{4}$-inch hardware. It is, however, subject to deterioration that is not normally visible. This deterioration results from the growth that takes place with the positive plates as the batteries age. In this particular battery, the seal formed by the o-ring between the terminal and case is broken allowing fumes and electrolyte to migrate up into the leaded joint that provides the post-to-terminal connection. This particular type of deterioration starts when the terminal to the case seal is broken by forces produced by positive plate growth. This growth is a continual process throughout the life of a lead-acid battery. In later models, battery manufacturers have improved the case-to-terminal seals and cell designs to minimize these effects.

Newer criteria for battery specification include double connectors throughout, independently bolted hardware for all connections of 5/16-inch stainless steel; heavy-duty 1-inch square post, which normally requires the purchase of a battery with a minimum 150 Ah rating, which, in many cases, exceeds the sizing needed for the application. The battery post and terminals are now one solid 1" nominal piece, without any leaded connection points. The interrow or step connections are also double. The double strapping has independent bolting.

Battery chargers, when disconnected from the station batteries or bus, as in an open-strap battery, produced a variety of undesired results such as "0" volts, extreme over-voltage 150 V+, and normal voltage with 130 V AC ripple.

Also, in the past, the battery alarm system used to sense under-voltage, open strap, and battery grounds, was set up so that the battery ground and open strap conditions produced one common alarm output.

The failure mechanisms of cells and the 120 interconnections making up a 120 V station battery are difficult to detect. Deterioration of the connection points takes place over a long period of time, slowly reducing through oxidation and corrosion the contact surface areas until the connection area can no longer support the load.

Charge current necessary to float charge a 100 Ah lead-calcium cell at normal float levels is only 100 MA, or about 1 A for lead-antimony-type cells of the same size. Alarm output would not occur with the ripple level, positive charge, or current center tap balanced voltage, until after the connection became incapable of supporting this small charging current. If a dc system is called upon during the period of a developing connection problem, such test systems would not be satisfactory.

If failures occured, as with a sudden snip of a wire, all of the detection methods would in time detect the failure. It has been found that the majority of battery and battery-strap problems can only be detected while current is flowing out of the battery. It is therefore essential that periodic load tests under full loads be performed frequently enough to insure the integrity of the system being monitored.

In order to overcome the deficiencies in the prior art as set forth hereinabove, Applicant developed a monitoring device that could accurately detect potential failures as well as actual failures which is disclosed in parent application Ser. No. 475,321 filed Mar. 14, 1983 now abandoned. The monitoring device disclosed therein is a Stationary Battery Monitor that not only monitors typical parameters, but provides an automatically controlled load test that could detect system deterioration as well as actual fault conditions. This monitor is a means to eliminate catastrophic failures in power stations resulting from the lack of battery system integrity and provides a load testing means that is implemented by applying a resistive load to the D.C. bus, placing the battery charger in current limiting and the load across the battery. During the loading period of a few seconds, cell group voltages are measured and compared to a predetermined alarm level. Should any cell group voltage fall below the detected alarm level, the test is immediately terminated and the signal to the alarm output latched, requiring a manual reset to clear the alarm condition. Initiation of the load test can be accomplished remotely by supervisory control, locally by a start test push-button or automatically by a preset timer. Safeguards are provided to prevent the test load from being permanently connected. Dual element 30 amp fuses provide primary protection. The fuses are time delay elements which operate in a failure mode after 25 seconds. The normal 10 second load test does not change the time-current characteristic of these fuses. Four 5 ohm 750 w resistors connected in parallel provide the 100 amp load. These resistors can operate at 5 times rated capacity for 10 seconds. Should the load contactor remain closed for any reason, the resistors become fuses after several minutes.

In brief, the battery monitor system disclosed in parent Ser. No. 475,321 (now abandoned) is connectable to at least one battery with cell groups of at least one cell for detecting and signalling faults by periodic load tests for detecting weak cells and high total strap contact resistance. The battery monitor system includes initiating means, load means, first lead means, second lead means, detecting means, comparator means and signal means. The initiating means is used to initiate the test. The load means is connected to the initiating means. The load means provides a load test for detecting weak cells and high total strap contact resistance. The load means imposes a load that would cause current to flow at a predetermined level of a magnitude in order to load each battery to the in service battery demand requirements.

A first lead means is connected across each battery and each cell group within each battery. The first lead means is connected to the load means and the initiating means. The second load means is connectable to each battery and each cell group within each battery. The detecting means is connected to the second load means for detecting voltage outputs from each cell group. The comparator means is connected to the detecting means for comparing each output from each cell group with a present value for detecting weak cells or for detecting high total strap contact resistance in a cell group. The signal means is connected to said comparator means for signaling the presence of a weak cell or a high total strap contact resistance. The load means includes at least one resistor. Each resistor is sized to carry over-loads for a predetermined in use time of a few seconds. The initiating means includes a contactor biased to an opened position with a drive coil timed to operate for a predetermined time equal to said predetermined in use time of the resistor.

At least one fuse is connected in the battery monitor system for fail safe use in a predetermined time greater than the predetermined in use time of the resistor. The comparator means detects weak cells and/or high total strap contact resistance in a cell group and the signal means signals weak cells and/or high total strap contact resistance in a cell group. The resistors are sized for fail safe use in a predetermined time greater than the predetermined failure time of this fuse and are of the edge-wound ceramic type. The time-delayed undervoltage contact prevents load test initiation when a low voltage condition exists. Should the fuses fail to open or the load test timer fail, the undervoltage contacts will drop the load after 60 seconds. Control circuitry and the load contactor are A.C. powered, insuring the load test feature inoperable should a loss of A.C. power occur. In addition, the monitor is connected to the power station's D.C. distribution panel through a circuit breaker providing another zone of protection.

The invention described in Ser. No. 475,321 appears to have been the only instrument in existance at the time of the filing thereof providing the means to automatically monitor battery system integrity dynamically and detect potential as well as actual fault condition.

The battery testing system described therein was designed to detect, perform integrity load tests, indicate and alert the central station via the supervisory control system, when battery system faults occur at the substation level. The entire system disclosed therein is self-contained for easy installation in the substation and continuously monitors abnormally high or low voltage conditions, an "earth ground" of less than 1000 ohms on either side of the battery system, and a loss of A.C. power to the charger. Battery and battery strap resistances are measured thereby during a 10-second 100 ampere load test performed automatically at pre-determined intervals. In addition, these tests can be initiated manually at either the central station or the monitor. Either 24 or 60 cell configurations can be monitored by the system.

The system described therein connects sense leads across the overall battery as well as cell groups within the battery. The system monitor senses the overall battery voltage continuously and alarms on either an abnormally high or sustained low voltage, which would signal a possible charger problem. The low overall voltage alarm takes normal load operation into account and requires that a low voltage condition be sustained for greater than one minute. An earth ground detector alarms if either the positive or negative side of the battery is connected to ground through less than 1000 ohms of resistance.

The system described therein further incorporates a unique integrity load test feature which is implemented by periodically applying a resistive load which draws approximately 100 amps for 10 seconds. While the load is applied, the voltage across each of ten groups of cells is measured and compared against an alarm level. The alarm level, which is adjustable, is typically set for somewhere between 0.5 volts to 1 volt below the normal cell group voltage for this type of load. This alarm level will detect weak cells or high total strap contact resistances for a group of cells greater than 5 milliohms.

Load current is verified during the test by monitoring the voltage across the load resistors and alarms on loss of load current. These load test alarms are latched for ease of trouble-shooting. Contact closures are available for customer use for all of the alarms and can be used to trigger either a local alarm or connected to the supervisory control system. Any load test alarm must be reset from within the monitor. Any alarm that is sensed will stop a load test and prevent the start of a new test. Light emitting diodes mounted within the system monitor are used to identify the type of alarm as well as which group of cells failed the load test. The load test can be initiated either by a remote contact closure, such as from the supervisory control; by a local push-button switch; or by a customer programmable timer which can be adjusted for intervals from one and one-half days to ninety-six days. The system described therein is easily installed and maintained. Calibration adjustments are available for each of the alarm levels. There are available a test/calibration unit which can be plugged into the monitor in place of the battery test leads. These calibration checks are recommended once a year. To protect the customer's battery against any possible system load test failures, the following precautions have been provided in the system disclosed in Ser. No. 475,321. The load is switched by an A.C. fail-safe, heavy duty contactor. The load is timed off by a 10-second timer which is backed up by thermally operated fuses in each side of the load line. These fuses are designed to blow in approximately 25 seconds. The low voltage alarm will trip on a sustained load condition.

SUMMARY OF THE INVENTION

While the invention disclosed in application Ser. No. 475,321 filed Mar. 14, 1983, has been commercially successful and is quite useful in a variety of applications, the present invention includes several structural and functional improvements thereover which greatly increase the flexibility, accuracy and usefulness of the concepts taught in the prior application. In this vein, it is believed to be useful to compare the subject matter disclosed in the prior application with that which is disclosed herein so that the contrast therebetween will become evident.

Firstly, the prior invention includes circuitry which comprises a relatively inflexible circuit. In the present invention, a programmable micro-processor is provided which allows infinite flexibility for a variety of applications. Further, the prior invention includes channels for ten evenly divided cell groups whereas the present invention includes channels for up to two hundred fifty-six cells in an expandable structure which is programmable to handle any number of odd or even cells. Further, the present invention includes other channels for measuring of current, temperature and up to five other measurements or sensing functions.

In the prior invention, measurements are limited to a maximum of 125 volts DC for lead acid cells and 48 volts DC for nickel cadmium cells whereas in the present invention, monitoring may take place for up to seven hundred fifty volts DC series strings for lead acid or nickel cadmium or for lower voltage strings when connected in parallel. Further, the prior invention would monitor the 125 volt DC battery by scanning ten groups of six cells each whereas the present invention using a 32 channel configuration would have two cells per group to thereby significantly improve the detection of abnormal conditions. Additionally, the accuracy of the prior invention was to within plus or minus two percent whereas the present invention is accurate to within 0.1 percent of reading ±1 least significant digit, and to within 1 percent of count.

Regarding indications of abnormality, the prior invention includes one light emitting diode indicator for each type of failure and cell group whereas the present invention includes this feature and additionally includes indicators for the mode of operation when failure and/or alarm occurred.

The prior invention includes no memory and thereby no data availability, whereas in the present invention full data is available on sight or remotely and facility is provided to monitor data, test the integrity of data and keep historical data of testing functions with the memory being sufficiently large so as to store up to seven complete sets of data or two hundred twenty-four records of a single type of data.

In the prior invention, alarms are provided for each type of failure whereas in the present invention two different alarm levels are provided which immediately indicate whether routine maintenance is required or whether immediate action is required.

In the prior invention, integrity tests may be conducted with a built-in 100 amp load, however, there is no external control capability, although the integrity tests may be conducted manually or automatically during a fixed time duration of momentary load with remote or on-sight test initiation and remote and local alarms by contact closure. In contrast to this, the present invention includes a vast selection of various load units depending upon the desired load levels and battery voltage, external controls may be utilized to control the integrity tests, manually or automatically and in a programmable manner and a customer's modem may be utilized so as to provide full test data when used therewith.

In the prior invention, no capacity tests nor recharge mode monitoring are available. Conversely, in the present invention, complete capacity tests may be performed with automatic data logging and regarding recharge mode monitoring, the present invention includes an alarm which is activated if the battery does not return to normal after recharge.

The prior invention includes a continuous scan mode which monitors overall voltage as well as ground faults. The present invention includes a continuous scan mode which monitors overall voltage, cell voltages as well as current and temperature.

The prior invention includes a calibration aspect which requires three known voltages and the adjustment of three controls, whereas the present invention is self-calibrating only requiring the knowledge of one voltage so as to perform this function.

Accordingly, it is seen that the present invention includes a number of significant improvements over the prior invention. Accordingly, herein, an invention has been disclosed which includes significant steps forward vis-a-vis the prior art by incorporating into a battery testing and monitoring apparatus the following features, modes and operations:

(a) In a first aspect of the present invention, continuous monitoring of overall battery voltage, individual cells or cell groups and further system variables is available. The actual readings obtained from the cells are compared to two programmable low voltage alarm levels. One of these alarm levels signals that an equalization charge is required and the other alarm level signals that a cell or cell group has failed. The overall voltage may be compared with high and low level alarms which are user programmable and act to signal problems with the charger or rectifier. The scan mode may be utilized to sense an open conduction path problem which is detected by reading a normal overall voltage while at least half of the cells are below normal flow levels.

(b) The system includes a momentary load test mode which may be initiated by one of a local push button, a remote contact closure, or a built-in interval timer. When a load test is commenced the invention provides contacts to activate either an external resistive test load or to trip the alternating current power to the battery system charger/rectifier which forces the battery to pick up the equipment load. The load is applied for a programmable period of time or until the overall battery voltage reaches its programmable low level alarm. If the test runs for the programmed time without reaching the low voltage alarm level, the battery passes the load test and no alarm is activated. If the low voltage alarm is reached during the load test mode, the test is immediately terminated with the activation of the appropriate alarm. A further continuous constant current load test mode is described in greater detail hereinafter.

(c) After a load test as described hereinabove exceeds a predetermined period of time, the invention automatically enters into a battery recharge or battery recovery mode where it continuously scans the overall voltage of the battery as well as individual cells or cell groups while the recharging takes place. At the end of a predetermined time, the invention will alarm unless the voltages scanned thereby are within their normal range as called for in the scanning mode described hereinabove.

(d) The present invention has incorporated therein certain failsafe features which protect not only the present invention but the battery which is being monitored thereby. A first of these features comprises thermal fuses which are provided in the circuitry and are designed to blow a predetermined amount of time after load tests were to have been terminated. If load tests extend beyond these predetermined period, these thermal fuses blow to thereby protect the circuitry.

(e) A further one of these features comprises circuitry which acts to terminate momentary or continuous load tests if voltage in the circuit drops below predetermined overall and/or cell set points.

(f) The load applied by the present invention is controlled by an alternating current fail-safe heavy duty contractor and upon loss of alternating current power, the invention automatically sets up an alarm and the micro-processor and memory thereof are maintained by integrally equipped batteries preferably made of lithium. Thus, when the present invention becomes operative again, re-programming is unnecessary with the memory being maintained intact.

(g) As stated hereinabove, the present invention includes a micro-processor computer. Any malfunctions in this device will result in the entire system being shut down to thereby prevent any load tests with an improperly functioning computer.

(h) The present invention is specifically designed so as to enable the connection thereto of certain optional features and equipment. These may include a portable programming, display and printer terminal, a cassette device for mass data storage, a momentary load unit for integrity tests, power measuring equipement, temperature measuring equipment, earth ground fault detection alarming means, extra memory devices for expanding the historical data, additional cell voltage input channels for higher voltage or multiple string batteries than those normally encountered as well as control outputs beyond those in the standard unit.

Accordingly, it is a first object of the present invention to provide a battery monitoring and testing system enabling great flexibility and accuracy.

It is a further object of the present invention to provide a battery monitoring and testing system which enables the collection of historical data on battery operation.

It is a further object of the present invention to provide a battery monitoring and testing system which enables the testing of the battery under load and for predetermined period of time.

It is a still further object of the present invention to provide continuous surveillance by the present invention of battery voltage, charger power and ground fualt.

It is a further object of the present invention to provide a device which enables the detection of weak cells within a battery as well as weakness in the battery as a whole.

It is a yet further object of the present invention to provide a system which is designed so as to enable the connection thereto of external controlling devices as well as storage devices so as to enable the enchancement of the flexibility thereof.

These and other objects, aspects, advantages and features of the present invention will be better understood from the following disclosure when read in conjunction with the appended drawing figures.

BRIEF DESCRIPTION OF THE DRAWING

FIG. 3 shows a schematic depiction of the inventive load unit.

FIGS. 4a-g when assembled together in accordance with FIG. 4h show the electrical circuit diagram of a preferred construction of the inventive monitor.

SPECIFIC DESCRIPTION OF THE PREFERRED EMBODIMENTS

Figure 1:
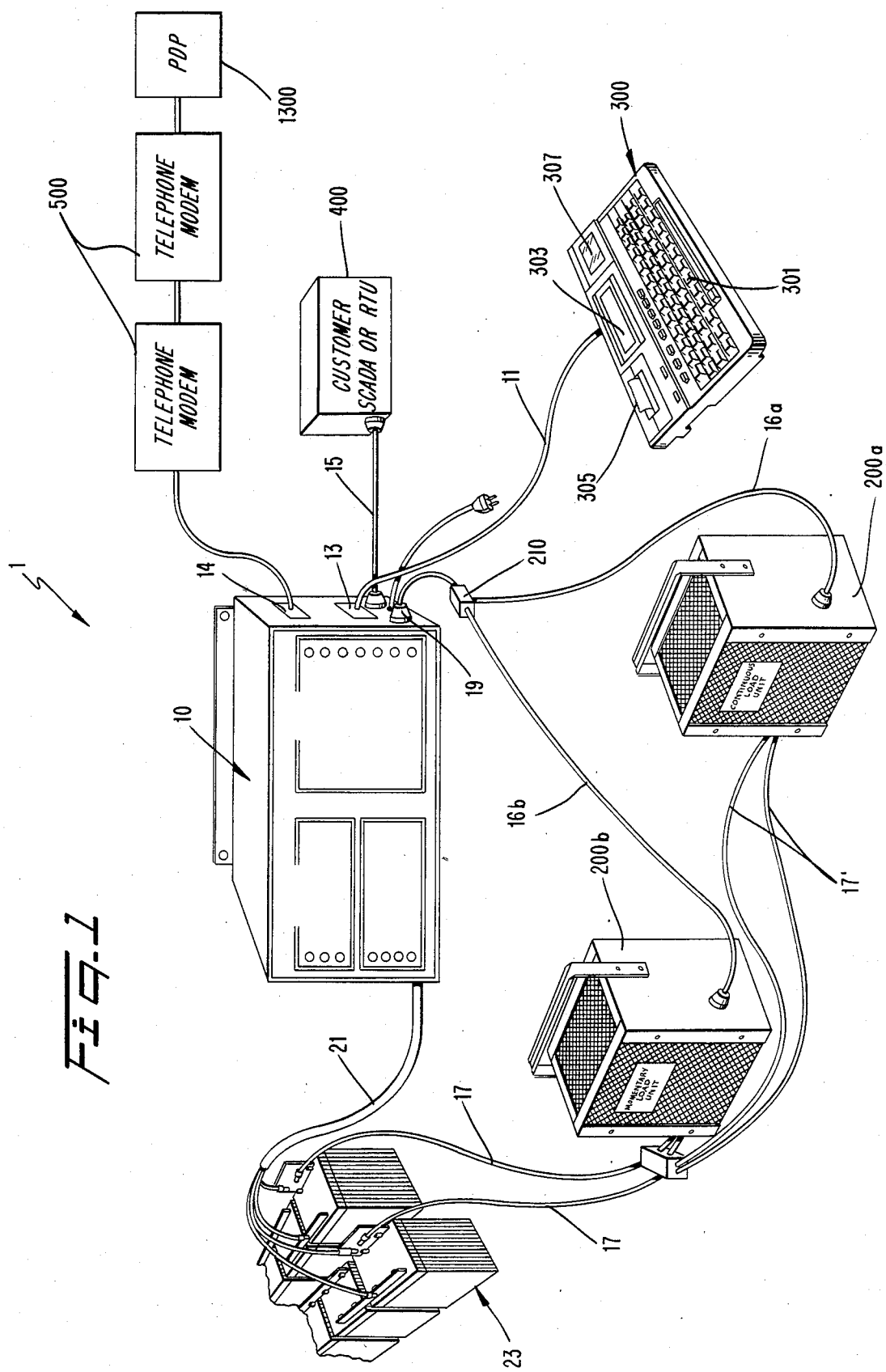
FIG. 1 shows a perspective view of one preferred form of the present invention.

Reference is first made to FIG. 1 which shows the entire battery testing and monitoring system as contemplated herein. As shown in FIG. 1, the system includes a battery monitoring unit 10, a portable or stationary loading units 200a and 200b, a programming/display/printer terminal 300, a supervisory control unit 400 and a remote PDP 1300. As shown in FIG. 1, the programming/display/printer terminal 300 is electrically connected to the monitor 10 by virtue of the cable 11 which inputs to the monitor 10 via a standard RS-232 interface socket 13. The supervisory control 400 may similarly be connected to the monitor 10 via a cord 15 and a further socket not shown in detail in FIG. 1. The load units 200 may be connected to the monitor 10 by a cord 16 having a plug 19 thereon and the system further includes a cable 21 comprising a sensing lead which receives electrical signals from each cell of the batteries 23 which are being tested by the system and interprets signals received by the cable 21 for purposes to be described in greater detail hereinafter.

Figure 2:
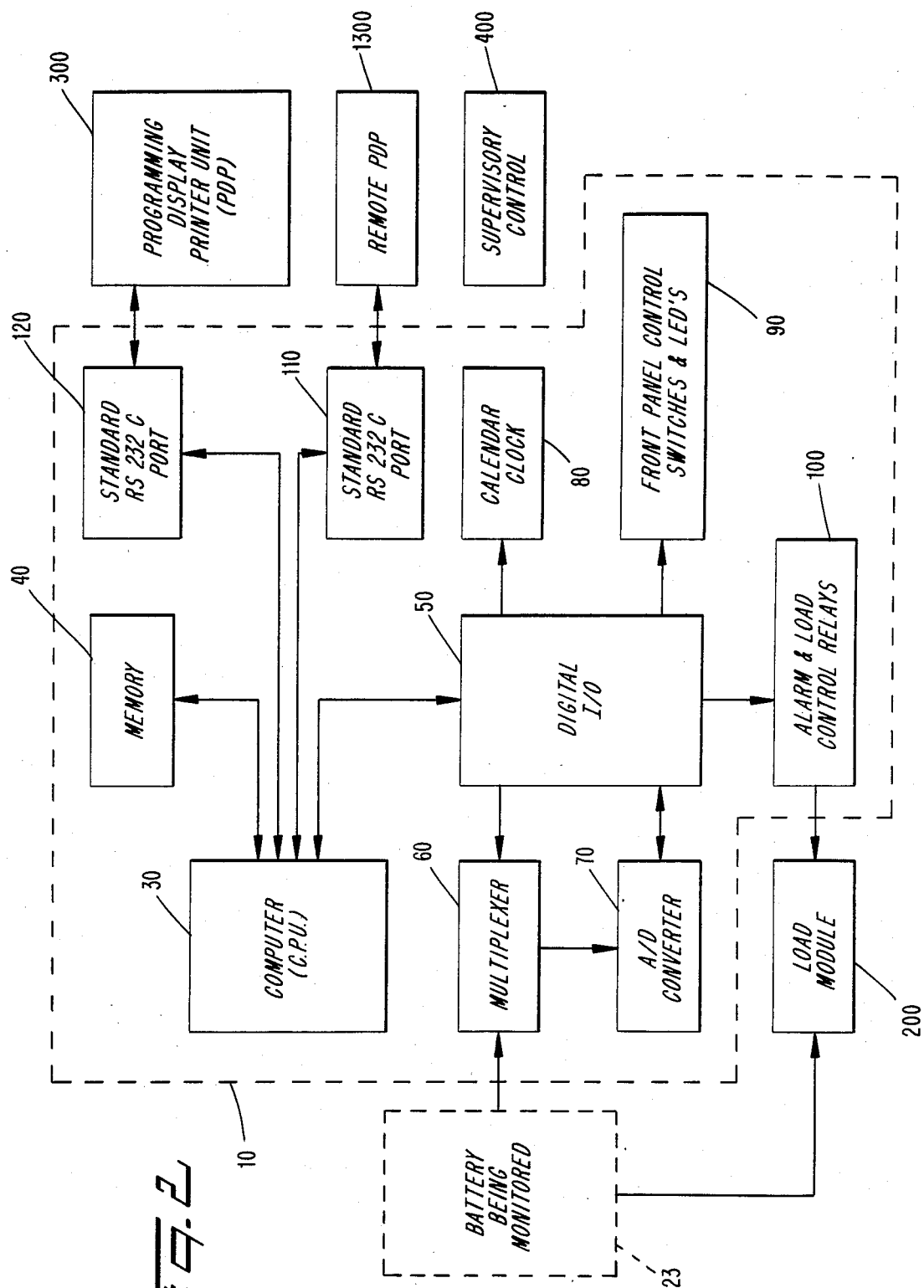
FIG. 2 shows a block diagram of the interconnection of the components of the present invention.

Reference is now made to FIG. 2 which shows in schematic form the details of the monitor 10. As shown therein, the monitor 10 consists of a computer 30 having electrically connected thereto a memory 40 a digital input/output device 50, a multiplexer 60, an analog-to-digital converter 70, a calendar clock 80, a front panel subsystem 90 including control switches and display, preferably in the form of light emitting diodes, and two standard RS 232 interface connection ports 110 and 120.

The computer 30 comprises a central processing unit which may, if desired, be of an eight-bit configuration. The computer 30 executes a set of instructions stored in the memory 40 and communicates with the external programming display printer 300 via the RS 232 interface port 120. The P.D.P. control keys on keyboard 301 allow the user to communicate to the computer 30 instructions as to user-programmable set points and test conditions, which are stored in the memory 40. The multiplexer 60 receives signals from the battery 23 which is being monitored via the cable 21 and feeds signals indicative of battery parameters to the computer 30 via the analog-to-digital conveter 70 and the digital input/output device 50.

The computer 30 utilizes preprogrammed stored instructions to send these instructions to the input/output device 50 to thereby cause a pulse train to be generated on the output thereof. This pulse train acts to drive a serial shift register and sets up its parallel outputs in a logical combination automatically so as to cause the appropriate multiplexer channel to be energized.

The multiplexer 60 may be made either in a solid state construction or through the use of relays and acts to select the appropriate input channel wires to the input of the analog-to-digital converter 70.

The analog-to-digital converter 70 is of the dual slope integration type and converts the input analog signal received from the battery 23 via the multiplexer 60 in analog form to an output pulse train. The number of pulses which represent the reading as received by the analog-to-digital converter 70 are counted by a 16-bit binary counter as will be described in greater detail hereinafter which is incorporated in the analog-to-digital converter 70.

The above described pulse transfer takes place through an optically coupled isolator and the count is retained in the counters forming a part of the analog-to-digital converter 70 long enough for the computer 30 to read the number count via the parallel input/output port.

After an input reading has been taken by the computer 30 it is temporarily stored in the memory 40 and then compared to the appropriate alarm set points which have been preprogrammed in the memory 40. If an alarm condition is detected, the computer 30 causes the appropriate alarm relays and front panel light emitting diodes to be energized and also enters an alarm record into the memory 40. The light emitting diodes and relays are driven by a serial shift register located in the input/output device 50 which is activated by commands from the computer 30 delivered to the parallel input/output port.

The calendar clock 80 may be set and read by the computer 30 via a parallel input/output port located in the digital input/output device 50. The computer 30 reads the clock every time an alarm record is stored and whenever a current data printout is requested. The reading of the calendar clock 80 is printed on all printed data records in the form of a date and a time.

As shown in FIG. 2, the second RS 232 port 110 may be connected to a supervisory control 400 which allows the transfer of data from the monitored battery 23 to a remote location and also allows the user to order the monitor 10 to initiate load tests and data readout from the remote location.

Also included in this system (not shown in FIG. 2) is a buffer drive circuit 130 used in a manner well known in the art to buffer the address, data and control lines of the computer 30.

As shown in FIGS. 1 and 2, the system of the present invention includes as an important part thereof the load units 200a and 200b (collectively referred to herein with the reference numeral 200) which may be either of a portable or stationary construction and which are devised so as to enable the testing of a battery with a momentary load or a continuous constant load which changes so as to maintain a constant current. A schematic diagram of the load units 200 is depicted in FIG. 3. As shown therein, the load unit 200a includes a central processing unit 201 and a continuous load testing block 203. The central processing unit 201 includes current sensing means 207 enabling the sensing of current in the battery 23 being tested during the continuous load testing phase of operation of the load unit 200, and a switch controlling device 211 for controlling switches in the continuous load testing block.

The continuous load testing block 203 includes a plurality of resistors 213 connected in parallel with one another in the circuit 215 with each resistor 213 having associated therewith a switch 217 controlled by the central processing unit 201, particularly the switch controlling device 211.

When the battery 23 is being tested for continuous load, one object is to maintain the current constant during the testing procedure. Thus, during the initial portion of the test, the battery's voltage will be relatively high and as the test is conducted, the battery's voltage will reduce. Thus, the central processing unit 201 includes integrally formed therewith a current sensing device 207. When the continuous load test is commenced, with at least the resistor 218 providing a load on the battery 23, the current is sensed by the current sensor 207. As the battery drains of power, the voltage begins to reduce and with the resistance fixed, the current correspondingly reduces. Thus, in order to maintain the current at the prescribed level for the test, the resistance across the battery 23, must correspondingly be reduced. Thus, when the current sensor 207 senses that the current is reducing, this indication causes the central processing unit 201 to activate the switch closing device 211 to begin to sequentially close the switches 217 to thereby place one or more additional resistors in parallel with the resistor 218 and into the circuit including the battery 23. The parallel nature of the resistors 218 and 213 causes the total resistance in the circuit to reduce as is well known to those skilled in the art and accordingly, this reduction in resistance will cause the current level to be correspondingly increased until the current sensor 207 senses that the current is at the prescribed level. A sufficient number of resistors 213 with corresponding switches 217 is provided so as to enable the battery 23 to be tested throughout the desired time period.

Another test which is helpful in gauging the operation of a battery is a momentary load test with a fixed resistor. For this purpose, the momentary load test unit 200b has a momentary load testing block 205 which includes a fixed resistor 219 placeable across the battery 23 through the activation of the switch 221. The switch 221 is activated by the user either at the supervisory control 400 or through depression of the appropriate button on the module 10. A timer (not shown) is provided in the monitor 10 for use with both load units 200. The timer is used by the CPU 30 to time load tests for time periods as preprogrammed into the EPROM units and may, if desired, be incorporated into the calendar clock 80. When used with the unit 200b, it is operated so that each cell of the battery is tested for only a short period of time in a sequential manner. All of the functions of the load unit 200b are controlled through the load control cable 16 shown in FIG. 1 by the monitor 10 via either the supervisory control 400 or the programming display printer 300.

As shown in FIG. 1, the load control cable 16 has a switch 210 connected thereto which has two output lines 16a and 16b, for the respective load units 200a and 200b. The switch 210 allows the user to connect and disconnect the load units 200a or 200b from the circuit. Similarly, the load cable 17 has a switch 220 connected thereto which receives load cables 17a and 17b from the respective load units 200a and 200b and allows switching therebetween.

With reference back now to FIG. 1, the programming display printer terminal 300 is seen to be comprised of a typewriter-like keyboard 301, a display 303 which may be of the LED or LCD type, a paper printer 305 and a tape cassette device 307 which may magnetically record all displayed and printed information for storage purposes or for later reprinting.

Figures 4, 5, 6, 7, 8:
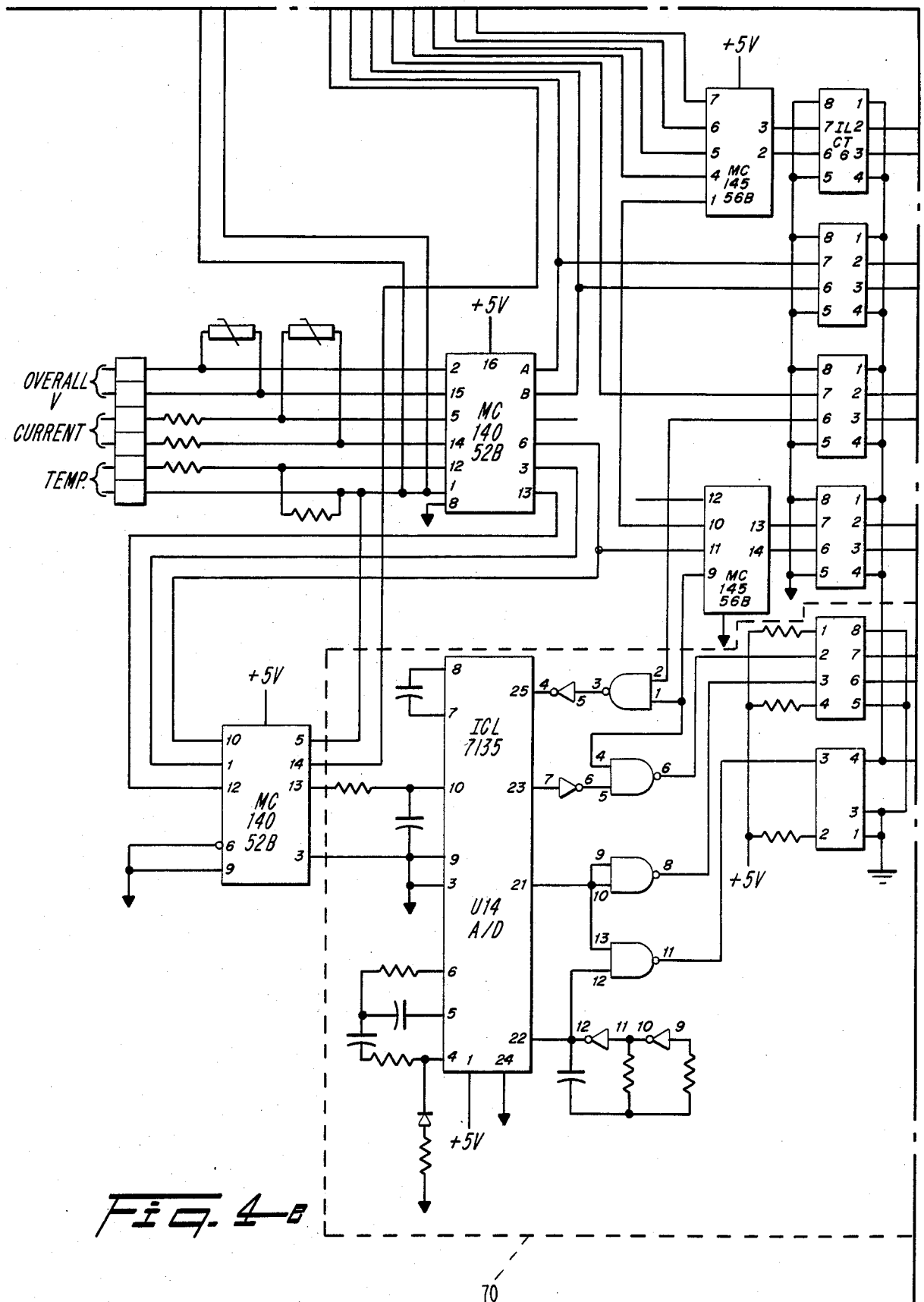
FIG. 5 shows an alternative construction of the programming/display/printer shown in FIG. 1.

FIG. 5 shows a modified programming/display/printer 300' made in a user friendly manner with the keyboard 301' thereof having programming command keys 302 and numerical keys 304' which allow the user thereof to operate the system 1 without the necessity of typing commands and instructions letter by letter. Also shown are display 303' and printer 305' while the tape cassette device is omitted for simplicity.

Reference is now made to FIG. 4 which consists of FIGS. 4a–4g assembled together as shown in FIG. 4h. FIGS. 4a–g when assembled together as shown in FIG. 4h show the circuitry of the monitor 10 as schematically depicted in FIG. 2. Hereinafter, FIGS. 4a–4g will be collectively referred to as FIG. 4.

With reference now to FIG. 4, it is seen that all of the components schematically shown in FIG. 2 are also shown in FIG. 4 except that FIG. 4 also shows a buffer drive portion which will be described in greater detail hereinafter. As will be evident from the description set forth hereinbelow, each of the various components making up the monitor 10 may, if desired, consist of common off-the-shelf components, well known to those skilled in the art which are put together in the unique unobvious way disclosed herein. However, although particular examples are given hereinbelow of the specific manufacturers and model numbers for the various components, it is to be stressed that these are merely considered to be examples of the components which may be used in constructing the present invention. Those skilled in the art should have sufficient knowledge so as to enable them to substitute one element for another for reasons of flexibility, capacity, etc. without departing from the intended scope of the present invention.

With this in mind, FIG. 4 shows the central processing unit 30 as mainly being comprised of a MC6809 Micro-processor manufactured by the Motorola Corporation. The input multiplexer 60 comprises a C-MOS FET analog multiplexer which may, if desired, be that which is manufactured by the Motorola Corporation and designated by the part number MC14051. If desired, however, this input multiplexer may be replaced with a 5 volt coil double pole double relay multiplexer manufactured by Aromat and designated as the DE2 series.

The analog-to-digital converter has an operation well known to those skilled in the art and may comprise a GE/INTERSIL ICL 7135 device in the main. The digital input/output device 50 in one form thereof may include two industry standard 6522 chips one of which communicates with the analog-to-digital converter 70 and the other of which communicates with the calendar clock 80. If desired, a serial shift register shown in FIG. 4 with the designation U13 may also be incorporated therein.

The calendar clock 80, may, if desired, consist of an Oki MSM5832 clock device including a 24 hour clock mechanism and a calendar preprogrammed for days of the week, months, years and leap years if desired.

The memory 40 may take on many forms as desired depending upon the complexity and capacity of the system. As depicted in FIG. 4, the memory unit 40 consists of two RAM units and three EPROM units. The RAM units may, if desired, be RCA 6116 devices and the EPROM units may, if desired, be Motorola MC 2732 units. As is well known to those skilled in the art, the RAM units are utilized by the central processing unit 30 to temporarily store data, in this case test results and compare those results with alarm levels preprogrammed into the EPROMs and are also used as the source for information which is displayed by the PDP 300 and which is transferred to the magnetic tape 307 or to the printer paper via the paper printer 305.

The EPROM units are programmed with hard memory which is retained therein even when the monitor 10 is powered down. Conversely, any information contained within the RAM units is lost when the monitor unit 10 is powered down, thus, any information contained in the RAM units which is desired to be retained for future reference must be transferred to paper via the printer 305 or on the magnetic tape by the device 307 prior to powering down of the monitor 10. If desired, however, a separate portable battery may be provided to maintain continuous power supply to the RAM units.

The buffer drives 130 as shown in FIG. 4 consist of two 74LS 244 uni-directional buffer devices, a uni-directional 74 LS 367 device and a bi-directional 74 LS 245 device. The buffer drives 130 are provided as is well known by those skilled in the art so as to expand the capabilities of the CPU 30 and in this manner the buffer drives 130 act as an amplifier amplifying the potential applications of the CPU 30.

Again, it is stressed, that the above described particular components which may be assembled together as shown in FIG. 4 to construct the present invention are merely considered to be examples of the devices which may be so used. Accordingly, the mere disclosure of particular examples is not to be construed as limiting in any way of the present invention.

In order to further understand the operation of the present invention, with reference to FIG. 1, it is stressed that the load cables 17 which connect the load units 200 to the batteries which are being tested, merely connect to the main terminals of the batteries. The sensing leads 21, on the other hand, which connect the battery output to the monitor 10 connect each individual cell of the batteries with the monitor 10 so that with a momentary or continuous load placed on the battery or batteries by one of the load units 200, each battery may be tested both as to the battery as a whole and as to each cell individually based upon the load placed thereon.

The present invention as explained and described hereinabove is programmable to the extent that all alarm set points, and load test parameters, may be preprogrammed by the user either through the use of the programming display printer 300 or by the remote PDP 1300 connected to RS 232 port 14 by telephone modems 500 as is well known by those skilled in the art so as to allow communication between the PDP 1300 and the monitor 10 through existing telephone wires. The remote PDP 1300 essentially performs all of the functions of the programming display printer 300 but from a remote location such as a centralized office or other facility remote from the batteries 23 which are being tested. Further, the calendar clock 80 may be preset to the correct time and date as desired. The present invention can perform load tests on batteries as well as momentary tests thereon and will alarm on out of tolerance conditions as preprogrammed and further, the circuitry may be programmed so as to terminate the testing procedure automatically if battery conditions are detected that could lead to permanent damage thereof. Through the use of the features of the PDP 300 or remote PDP 1300, all records pertaining to the testing of the batteries may be stored in a magnetic medium such as a cassette tape and also may be printed out through the use of the paper printer 305 or 305'. Through the versatility of the CPU 30, and associated equipment as depicted in detail in FIG. 4, the present invention may be expanded in uses to monitor other battery parameters such as hydrogen levels, ambient temperature, electrolyte levels, AC power board, etc. Of course the circuit depicted in FIG. 4 may be modified as well known to those skilled in the art to provide as many auxiliary input and output terminals as are necessary for the connection thereto of any and all contemplated accessories.

The supervisory control 400 shown in FIG. 1 does not allow programming of the monitor 10, but enables a remote user to receive routine maintenance alarms and emergency alarms while enabling the user to reset alarms, start load tests, stop load tests and, if desired, receive test data in display form.

In the operation of the present invention as depicted in FIGS. 1-4, two main operating modes as well as a third recharge mode are contemplated and are preprogrammed into the system 1. The first mode may be designated the scan for monitor mode. As shown in FIG. 1, the front panel of the monitor 10 includes a button designated "scan mode" and an LED designated "scan." The present invention will be in the scan mode whenever load tests are not being conducted and recharging has been completed. When the system is in the scan mode, the light adjacent the word "scan" is lit and in a manner well known to those skilled in the art, the central processing unit 30 follows the scanning instructions preprogrammed into the EPROM units contained in the memory 40.

This mode may be considered to be the normal operating mode for the system. In this mode, all individual cells of each battery being tested, overall battery voltage current and temperature are continuously monitored. Each reading which is taken is admitted to one of the RAM memory units contained within the memory 40 and after being so entered is compared to the preset alarm level stored in the EPROM units and then maintained in temporary storage. As one example of the operation of the present invention, if six or more consecutive readings are taken which fail to be within the desirable operating range for a particular parameter, the appropriate alarm relays and LED alarm lights are energized. Since the present invention is designed to have a scan rate of approximately 10 parameters per second, a complete scan of a 60 cell battery takes less than 10 seconds.

In the scan mode, the overall voltage of the battery or batteries is compared to a high and a low limit which is programmed into the EPROM units. Since one of the most harmful things that can be done to a battery is over or under charging thereof, this alarm feature is essential as enabling the system user to determine the potential lifetime of the batteries being tested and to extend the life thereof by maintaining the voltage within prescribed parameters. Further in this regard, the system enables the individual cell voltages to be compared against both a high and a low level which enables the user of the system to be made aware of the need for equalization of individual cell voltages.

Further, in the scan mode, the current is compared against both a high and low level so as to enable verification that the float charge level is within acceptable limits. This alarm feature also may be utilized to measure battery load current and in this aspect the alarm can be set for abnormal load conditions.

A pilot cell is chosen for each battery tested and a probe is included which enables measurement of the pilot cell temperature and subsequent comparison of this temperature to a high alarm level programmed into the EPROM units which warns of a temperature condition which may be harmful to the battery.

Through the use of the PDP 300 or remote PDP 1300, all of the alarm levels described above are user programmable and may also if desired be programmed by the manufacturer's thereof prior to shipment to the customers.

In the scan mode, when a parameter of the battery is such that it causes an alarm to be encountered, the present invention is designed to do the following:

(a) alarm relays and LED displays are energized;
(b) any load testing which was taking place is inhibited;
(c) an alarm record is taken and stored including all cell voltages, overall voltage current, temperature, time and date.

All of this data is stored in an alarm register in one of the RAM units so that it may be displayed, retained in magnetic memory and/or printed out by the printer 305. In order to place the device back in the scan mode, the reset alarm button shown in FIG. 1 must be depressed, however, the present invention is specifically designed so that unless the condition which caused the alarm has been physically removed, resetting the alarm and placing the device back in the scan mode will only cause the above described alarm sequence to repeat itself. If desired, the present invention may be programmed so that a complete battery record may be printed, for example, once a week duting the scan mode.

The second main mode of operation of the present invention consists of the load test mode which is performed in conjunction with one or both of the load units 200 described in detail hereinabove, particularly with reference to FIGS. 1 an 3. The load test mode is commenced by depressing one of the buttons having the words "start mom. load test" or "start cont. load test" adjacent thereto as best seen on the front panel of the monitor 10 in FIG. 1. Depression of one of these buttons causes the system to operate as preprogrammed in the EPROMs of the memory 40. When one of these two buttons has been depressed, the LED adjacent the words "load test mode" will be lit and switching of the switches 210, 220 will place the appropriate one of load units 200a, 200b into the circuit.

When the momentary load test is initiated through the depressing of the appropriate buttons, one manner of operation of the present invention is to place 120 volts AC through the load control cable 16, 16b for sufficient time as controlled by the CPU 30 and timer (not shown) so as to enable the load unit 200b to test the entire battery under momentary load as explained hereinabove. As further explained above, the load cables 17, 17b are placed across the main terminals of the battery or batteries 23 and the sense leads 21 are connected to each individual cell so that as the momentary load is placed across the main terminals of the battery or batteries, the sense leads 21 receive signals indicative of the condition of each individual cell under momentary load. In order to ensure that the test is realistic, the monitor 10 waits several seconds before scanning the individual cells so that any transient conditions are eliminated. All results as received by the monitor 10 are transmitted through the interface 13 to the PDP 300 or through the interface 14 to the remote PDP 1300 via the telephone models 500 for temporary and/or permanent storage printing.

If desired, the load unit 200b may include in the momentary load testing module 205 thereof two series connected thermal fuses sized to open the circuit in a predetermined time, such as for example 25 seconds should the load test on its own volition attempt to continue beyond the pre-determined time.

As should be understood from FIG. 1, the momentary or continuous load test may be manually terminated at any time through depression of the "stop load test" button. After the momentary load test has been automatically completed, the continuous load test may be commenced through depression of the appropriate button shown in FIG. 1. During this test, as explained above, with reference to FIG. 3, and under control of the CPU 30 and timer (not shown), when the continuous load test is commenced, the resistor 218 of load unit 200a is placed across the battery terminals and the current sensor 207 senses reduction of the current due to voltage reduction in the battery 23 and responsive to such sensing causes the switch actuator 211 to close as many of the switches 217 as are necessary to sufficiently lower the total resistance of the resistors 213 and 218 as connected in parallel so as to maintain the current as sensed by the current sensor 207 within prescribed levels, so that the continuous load test is accomplished at a continuous constant current.

As explained hereinabove, the EPROM portions of the memory 40 are programmed with predetermined alarm levels representative of the particular battery installation being tested. As in the momentary load test if any individual cell or battery does not test out within the prescribed safe levels, alarms are immediately activated and the results which caused the alarm to be actuated are preserved in the RAM sections of the memory 40 for later printing or for magnetic retention.

After the two load tests have been completed, the monitor places the batteries 23 which have been tested into the third said mode, namely the recharge mode which is functionally similar to the scan mode described hereinabove except that any alarm levels which may occur are ignored for a preprogrammed period of time as controlled by the CPU 30 and timer (not shown) so as to enable the battery to recharge. The monitor 10 prevents any further load testing during the time in which the monitor 10 allows the batteries to be within the recharge mode. The connection of the recharger to the battery 23 is the same as that which is depicted in FIG. 1 of the parent application.

If desired, the EPROM sections of the memory 40 may be preprogrammed in a manner well known to those skilled in the art so as to enable the monitor 10 during the scan mode thereof to keep the following records:

(1) "Current data" may be kept which consists of a complete battery record including overall voltage, current temperature, and individual cell voltages, which data record may, if desired, be updated approximately every ten seconds to thereby represent the current condition of the battery at any given time. This "current data" may be printed by the portable printer 305 whenever desired merely by pushing a button on the keyboard 301 designated "print current data." The display 303 will also display the "current data" including every update thereof.

(2) "Alarm data" may be kept which is defined as the data present whenever a first alarm condition occurs, and when such a first alarm condition occurs, a complete battery record containing the date and time as taken from the calendar clock 80, overall voltage, current, temperature and cell voltages is entered into the memory. As explained hereinabove, an alarm condition is defined as any parameter falling outside the alarm levels preprogrammed into the EPROM sections of the memory 40. The system may be programmed to prevent nuisance alarms from occurring based upon transient conditions or normal momentary battery loads by preprogramming the EPROM section of the memory 40 to only consider an alarm condition to be present when it is sustained for a predetermined period of time, such as for example, sixty seconds. If desired, the keyboard 301 may have a button thereof designated "print alarm data" and by pressing this button the alarm record may be retrieved from the RAM storage portion of the memory 40. Also, the alarm may be reset by pressing the button on the monitor 10 adjacent the words "reset alarm."

(3) "Historical data" may be defined as a data record consisting of time and date, overall voltage current and temperature in addition to simple alarm status with hundreds of these daily records being storable only limited by the capacity of the RAM section of the memory. As presently contemplated, the RAM storage should be of sufficient capacity so as to enable the storage of approximately six months worth of these daily records. In such a scenario, after the full six months worth of records have been stored, as each additional daily record is stored, the earliest daily record is deleted. If desired, the keyboard 301 may include a button thereon designated "print historical data", the depressing of which will cause the printer 305 to print out all historical data contained within the RAM portions of the memory 40.

The status of any particular cell of the battery system 23 may be obtained through depressing of a button designated "cell select" on the keyboard 301 and in conjunction therewith depressing numerical buttons corresponding to the specific data such as temperature, voltage or current and numerical buttons corresponding to the particular cell the information about which is to be retrieved. For example, the code number 300 could be used in conjunction with the "cell select" button with the number 300 telling the memory 40 that "overall voltage" is desired to be read out.

Accordingly, an invention has been described hereinabove which achieves all of the objects set forth hereinabove and provides a trouble-free, reliable system for continuously monitoring the operation of a battery or batteries and for enabling the battery or batteries to undergo carefully controlled load testing procedures. Various changes, modifications, and alterations of the teachings of the present invention as set forth above may be contemplated by those skilled in the art without departing from the intended scope of the present invention. For example, as stressed hereinabove, the particular components set forth in FIG. 4 and the description thereof are merely to be considered exemplary and any comparable components as known to those skilled in the art may be substituted for the components illustrated and described. Accordingly, it is intended that the present invention only be limited by the terms of the following claims.

We claim:

1. A programmable battery testing and monitoring system comprising:
   (a) a monitor means connectable to battery means and including:
      (i) computer means;
      (ii) memory means connected to said computer means and including hard preprogrammable storage means and temporary storage means; and
      (iii) port means;
   (b) control means connectable to said port means for enabling a user to program said memory means and retrieve data indicative of monitoring and testing of said battery means from said temporary storage means;
   (c) load means connectable between said monitor means and said battery means for controllably placing a load on said battery means, said load means comprising a first fixed load momentarily placeable across said battery means to test the output voltage of said battery means under said fixed load and a second variable load controllable by said load means for testing said battery means under substantially constant current, said second variable load being varied responsive to sensing by said load means of current outputed by said battery to maintain constant battey means current level;
   (d) said system having a monitoring mode wherein said battery is substantially continuously monitored and a testing mode wherein said load means is connected between said monitor means and said battery means; and
   (e) fuse means incorporated into said first fixed load for opening connection between said first fixed load and said battery means after a predetermined time.

2. The invention of claim 1, wherein said monitor means further includes display means for displaying test information contained in said temporary storage means and for displaying whether said monitor means is in said monitoring mode or said testing mode, and switch means for controllably switching said monitor means into one or the other of said modes.

3. The invention of claim 1, wherein said monitor means further includes clock means for providing the time and date to said control means when said control means retrieves said data.

4. The invention of claim 1, wherein said hard storage means includes at least one EPROM chip which is programmable with alarm data regarding overall battery voltage, individual battery cell voltage, battery current and battery temperature.

5. The invention of claim 4, wherein said monitor means further includes alarm means, said computer means comparing said temporary storage means data with said alarm data and activating said alarm means when said temporary storage means data deviates from said alarm data by a predetermined amount.

6. The invention of claim 1, wherein said control means includes:
   (a) display means for displaying said temporary storage means data;
   (b) input means for programming said memory means;
   (c) printer means for printing permanent records of said temporary storage means data; and
   (d) magnetic storage means for permanently storing said temporary storage means data.

7. The invention of claim 1, further including further control means including telephone modem means connectable to said monitor means, for enabling remote control switching between said modes and remote retrieval of said temporary storage means data and programming of said memory means.

8. The invention of claim 1, wherein said second variable load comprises:
   (a) a plurality of resistors connected in parallel;
   (b) at least some of said resistors having switch means serially connected therewith so as to allow said some of said resistors to be selectively included in said variable load; and
   (c) said load means controlling said switch means to thereby control the resistance of said variable load.

9. The invention of claim 1, wherein said monitor means is connectable to each individual cell of said battery means.

10. The invention of claim 9, wherein said battery means comprises a plurality of storage batteries.

* * * * *